(12) United States Patent
Farino

(10) Patent No.: US 8,575,748 B1
(45) Date of Patent: Nov. 5, 2013

(54) WAFER-LEVEL PACKAGING WITH COMPRESSION-CONTROLLED SEAL RING BONDING

(75) Inventor: Anthony J. Farino, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 125 days.

(21) Appl. No.: 13/324,076

(22) Filed: Dec. 13, 2011

(51) Int. Cl.
*H01L 23/12* (2006.01)

(52) U.S. Cl.
USPC ............... 257/704; 257/710; 257/E23.193; 257/E23.127; 257/E23.18; 438/125

(58) Field of Classification Search
USPC .......... 257/678, 704, 710, E23.193, E23.127, 257/E23.18; 438/125, 126
See application file for complete search history.

(56) References Cited

U.S. PATENT DOCUMENTS 8,324,728 B2 * 12/2012 Tabrizi ...................... 257/728
2006/0292824 A1 12/2006 Beyne et al.

* cited by examiner

*Primary Examiner* — Hoai V Pham
(74) *Attorney, Agent, or Firm* — Martin I. Finston

(57) ABSTRACT

A device may be provided in a sealed package by aligning a seal ring provided on a first surface of a first semiconductor wafer in opposing relationship with a seal ring that is provided on a second surface of a second semiconductor wafer and surrounds a portion of the second wafer that contains the device. Forcible movement of the first and second wafer surfaces toward one another compresses the first and second seal rings against one another. A physical barrier against the movement, other than the first and second seal rings, is provided between the first and second wafer surfaces.

26 Claims, 2 Drawing Sheets

WAFER-LEVEL PACKAGING WITH COMPRESSION-CONTROLLED SEAL RING BONDING

This invention was developed under Contract DE-AC04-94AL85000 between Sandia Corporation and the U.S. Department of Energy. The U.S. Government has certain rights in this invention.

FIELD

The present work relates generally to wafer-level packaging and, more particularly, to seal ring bonding.

BACKGROUND

Various types of conventional electrical and electromechanical components require packaging in a clean hermetically sealed volume to function properly. For example, Radio frequency microelectromechanical (RF MEMS) technology provides moving sub-millimeter-sized components with RF functionality. Examples of RF MEMS components include resonators, oscillators, switches, switched capacitors, varactors, etc. As mentioned above, the functionality of components from RF MEMS and other technologies depends on the ability to provide the components in hermetically sealed environments.

In some conventional approaches, often referred to as wafer-level packaging, the components are provided within respective cavities formed in a surface of a silicon wafer. A set of seal ring metallization stacks (also referred to herein simply as seal rings) is provided on the wafer surface (e.g., using a metal lift-off process) in surrounding relationship to the respective cavities. Another wafer is provided with a similar set of seal ring metallization stacks on its surface. The pair of wafers is positioned in opposing relationship with their respective sets of seal rings aligned such that each seal ring on one wafer is in opposed relationship to a corresponding seal ring on the other wafer. This is illustrated in FIG. 1, which shows an opposed pair of seal rings 13 and 14 on an aligned pair of wafers 10 and 11, with the seal ring 14 surrounding a cavity 12 in wafer 11 where the component (also referred to herein as the "device") is provided.

The opposed pairs of seal rings are then moved forcibly into contact with one another, as shown in FIG. 2, and bonded together using a suitable bonding technique, such as eutectic bonding, thereby packaging the components between the two wafers 10 and 11, with each component hermetically sealed within its cavity 12 by the associated pair of aligned and bonded seal rings 13 and 14. In some instances, the resulting bonded wafer assembly is then sawed to singulate the packaged components for individual deployment. In other instances, the entire bonded wafer assembly is deployed in a larger assembly. Various conventional connection arrangements (not explicitly shown in FIG. 2) are available to permit electrical access to the packaged components externally of their sealed cavities. The configuration of the connection arrangement depends on the mode, of deployment of the packaged component.

Conventional seal ring bonding processes forcibly compress the opposed seal ring pairs against one another. This may cause the seal ring metallizations to deform beyond what is necessary for bonding, with various attendant problems.

It is therefore desirable to provide for controlling compression during seal ring bonding.

DETAILED DESCRIPTION

Example embodiments of the present work provide on each wafer an arrangement of stop surfaces. The stop surface arrangement includes inner and outer stop surfaces for each seal ring on the wafer. These stop surfaces extend generally parallel to the bonding surface of the associated seal ring. The inner stop surface is located inside the associated seal ring metallization stack, between the seal ring and the component cavity. The outer stop surface is located outside the associated seal ring, with the seal ring interposed between the outer stop surface and the cavity. When a seal ring pair is aligned in opposing relationship for bonding as described above, an associated pair of inner stop surfaces is aligned in opposing relationship to one another, as is an associated pair of outer stop surfaces.

Figure 1:
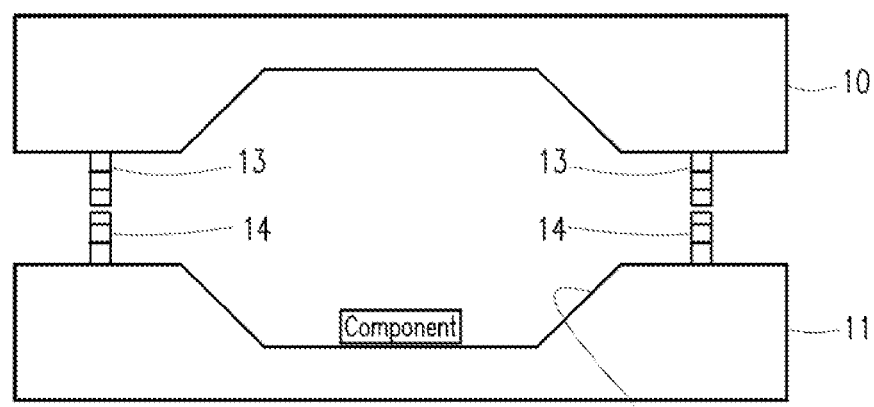
FIGS. 1 and 2 diagrammatically illustrate, in cross-sectional view, steps in conventional wafer-level packaging.
Figure 2:
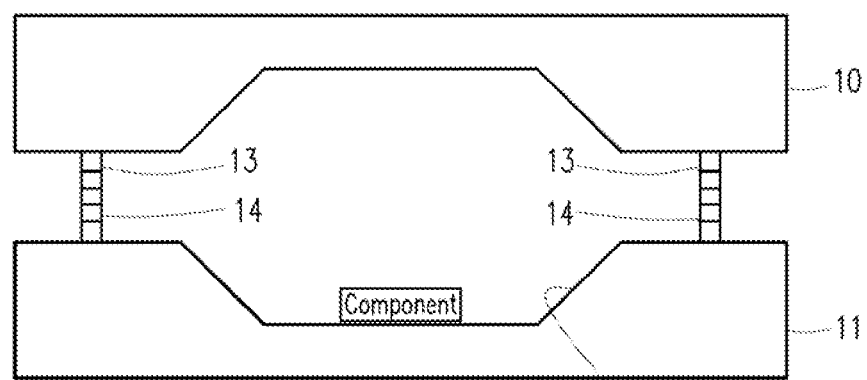

The stop surfaces are positioned such that, as the wafers are forcibly pressed together for seal ring bonding, the opposed bonding surfaces of the seal ring pair contact one another first, before the opposed pairs of inner and outer stop surfaces engage one another, so the seal rings begin to compress against each other. As the wafers continue to move toward one another and seal ring compression continues, the opposed pairs of inner and outer stop surfaces eventually contact one another and thus create a physical barrier that prevents further movement of the wafers toward one another, thereby preventing further compression of the seal rings. As a result, the seal ring metallizations are compressed sufficiently to achieve the desired bonding, but the eventual positioning of the inner and outer stop surface pairs in mutual engagement prevents further unnecessary compression of the seal ring metallizations, which further compression would otherwise occur without the stop surface engagement. This further compression occurs in the prior art approach of FIGS. 1 and 2. The present work thus controls the bonding process to limit the compression suitably.

Figure 3:
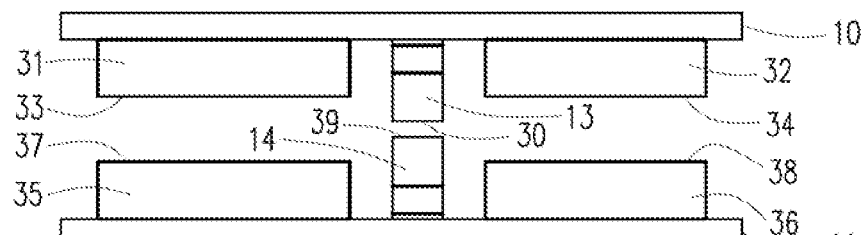
FIGS. 3 and 4 diagrammatically illustrate, in cross-sectional view, the use of stop surfaces that permit compression control during seal ring bonding according to example embodiments of the present work.

FIG. 3 diagrammatically illustrates the aforementioned stop arrangement according to example embodiments of the present work. As shown, the wafer 10 has deposited thereon stop structures (or "stops") 31 and 32, which provide respective stop surfaces 33 and 34. One of the stop surfaces 33 and 34 is the aforementioned inner stop surface, and the other of the stop surfaces 33 and 34 is the aforementioned outer stop surface. Similarly, the wafer 11 has deposited thereon stop structures 35 and 36, which provide respective stop surfaces 37 and 38. In some embodiments, all of the stops 31, 32, 35 and 36 are configured as continuous rings on the wafer surface having generally the same shape as the seal rings 13 and 14. Various embodiments provide the stops in various configurations. In some embodiments, all of the stops 31, 32, 35 and 36 (and thus their associated stop surfaces) are separated from the associated seal ring by a generally common lateral distance. In the example of FIG. 3, all of the stops 31, 32, 35 and 36 (and thus their associated stop surfaces) are shown having generally the same width, which is approximately four times the width of the seal rings. Various embodiments have stops of various widths.

In various embodiments, the stop structures 31, 32, 35 and 36 are, for example, silicon, or suitable oxide or nitride materials. The engaging pairs of stop surfaces 33/37 and 34/38 contact one another under the forcible compression and temperature/vacuum conditions of a conventional (e.g., eutectic) bonding environment. This interaction between engaging pairs of relatively smooth stop surfaces creates bonding between the associated pairs of stop structures 31/35 and 32/36. This stop structure bonding advantageously provides additional seals both inside and outside the seal created by bonding the associated pair of metal seal rings 13/14.

Figure 4:
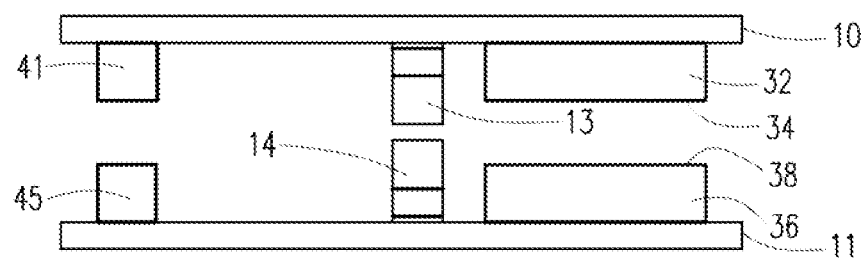

Although it is useful for a given pair of cooperatively engageable stop surfaces to have a common width, the pair of inner stop surfaces may have a common width that differs from a common width of the pair of outer stop surfaces. A specific example of such a configuration is shown in FIG. 4, which is generally similar to FIG. 3, except that stops 31 and 35 are replaced by narrower stops 41 and 45 having approximately the same width as seal rings 13 and 14. Depending on the embodiment, the stop surfaces 43 and 47, respectively provided by the stops 41 and 45, may function as either the inner stop surfaces or the outer stop surfaces, with the stops 32 and 36 functioning as the other pair of stop surfaces. FIG. 4 also shows that the narrower stops 41 and 45 are spaced laterally further from the respectively associated seal rings 13 and 14 than are the wider stops 32 and 36. In various embodiments, the narrower stops 41 and 45 are located at various distances from their associated seal rings.

In various embodiments of the type shown in FIG. 3, the common lateral distance between the seal rings and the stops 31, 32, 35 and 36 has various values, ranging, for example, from 20-50 um. In various embodiments of the type shown in FIG. 4, the common lateral distance between the seal rings and the stops 32 and 36 has various values, ranging, for example, from 20-50 um, while the common lateral distance between the seal rings and the stops 41 and 45 has various values, ranging, for example, from 50-500 um.

Although all stops of FIGS. 3 and 4 are shown at generally the same height, and both seal rings are shown at generally the same height, the relative heights of these features may be varied in various embodiments. Consider, for example, the arrangement of FIG. 3. When the respective bonding surfaces 30 and 39 of the seal rings 13 and 14 first contact one another, the stop surfaces 34 and 38 remain separated by a first separation distance equal to the amount by which stop surface 34 is offset from bonding surface 30, plus the amount by which stop surface 38 is offset from bonding surface 39. Similarly, the stop surfaces 33 and 37 remain separated by a second separation distance equal to the amount by which stop surface 33 is offset from bonding surface 30, plus the amount by which stop surface 37 is offset from bonding surface 39. If these first and second separation distances are equal, then the engagement of stop surfaces 34 and 38 will occur approximately simultaneously with the engagement of stop surfaces 33 and 37, regardless of whether all (or any) of the stops 31, 32, 35 and 36 have the same height, and regardless of whether the seal rings 13 and 14 have the same height. This separation distance condition also applies in FIG. 4. The combination of seal ring heights and stop structure heights in FIGS. 3 and 4 may be determined based on the particular value that is desired for the above-defined separation distance between stop surfaces. Smaller separation distance values limit seal ring compression relatively more, and larger separation distance values limit seal ring compression relatively less. In various embodiments, the separation distance has various values, ranging, for example, from 0.5-2 um.

Figure 5:
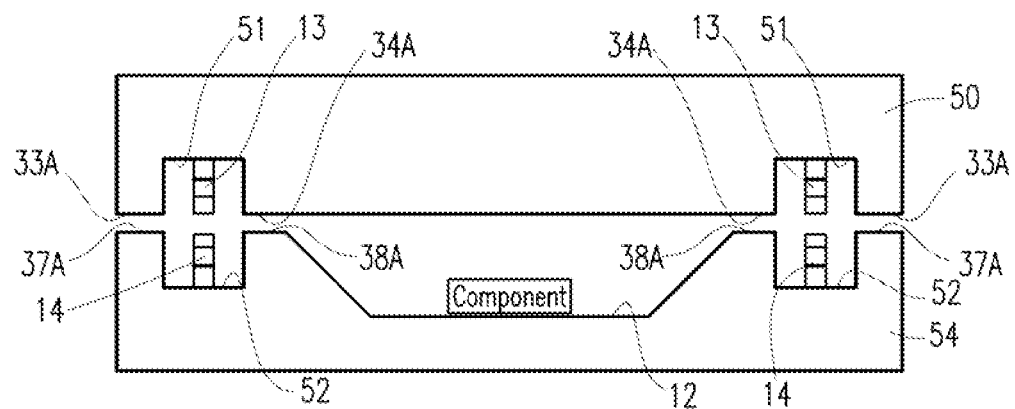
FIGS. 5 and 6 diagrammatically illustrate, in cross-sectional view, seal rings placed in trenches to produce stop surfaces that permit compression control during seal ring bonding according to example embodiments of the present work.

FIG. 5 diagrammatically illustrates another arrangement for controlling seal ring compression according to further example embodiments of the present work. In the example of FIG. 5 (showing packaging of single component only), stop surfaces 33A, 34A, 37A and 38A respectively functionally corresponding to the stop surfaces 33, 34, 37 and 38 of FIG. 3. The stop surfaces 33A, 34A, 37A and 38A are provided by depositing the seal rings 13 and 14 at generally central locations on the bottom surfaces of respective trenches 51 and 52 formed in respectively corresponding wafers 50 and 54. The trenches 51 and 52 have respective depths that are less than the heights of the respective seal rings 13 and 14. Thus, the stop surfaces 33A and 34A are integrally part of the wafer 50, and the stop surfaces 37A and 38A are integrally part of the wafer 54. The stop surfaces 33A, 34A, 37A and 38A are each offset by a common offset distance from the corresponding seal ring bonding surface. Thus, when the seal ring bonding surfaces first engage, the cooperating stop surfaces on wafers 50 and 54 remain separated by a separation distance equal to twice the common offset distance.

Figure 6:
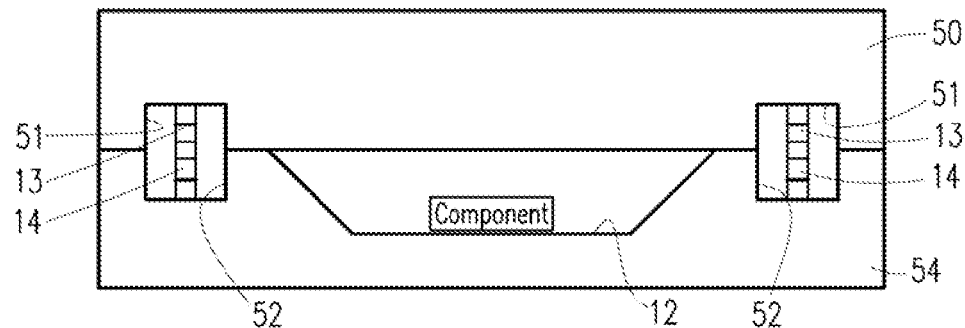

FIG. 6 diagrammatically illustrates a packaged component after seal ring bonding is completed. In generally the same manner described above relative to FIGS. 3 and 4, forcible engagement of the stop surface pairs 33A/37A and 34A/38A under conventional bonding conditions produces additional seals both inside and outside the metal seal that is formed by the bonding of the associated seal rings 13 and 14.

FIGS. 5 and 6 show trenches 51 and 52 having generally the same depth, and seal rings 13 and 14 having generally the same height. However, the relative dimensions may vary in various embodiments, as long as the separation distance between the stop surfaces is the same on both sides of the seal ring pair when the seal ring bonding surfaces meet. The combination of trench depths and seal ring heights in FIGS. 5 and 6 may be determined based on the particular desired value of the separation distance. In various embodiments, the separation distance has various values, for example, in the same separation distance range mentioned above with respect to FIGS. 3 and 4. In various embodiments, the trench depths have various values, ranging, for example, from 0.2-5 microns. In various embodiments, the trench widths have various values, ranging, for example, from 5-500 microns. In some embodiments, the trenches 51 and 52 are formed using a suitable conventional etching process (e.g., Bosch etching), and the seal rings are deposited onto the trench bottoms using suitable conventional techniques (e.g., a metal lift-off process).

Although example embodiments of the present work are described above in detail, this does not limit the scope of the present work, which can be practiced in a variety of embodiments.

What is claimed is:

1. A method of providing a device in a sealed package, comprising:
   aligning a first continuous seal ring provided on a first surface of a first semiconductor wafer in opposing relationship with a second continuous seal ring that is provided on a second surface of a second semiconductor wafer and surrounds a portion of the second wafer that contains a device to be packaged;
   forcibly effecting movement of the first and second wafer surfaces toward one another with the first and second seal rings aligned in opposing relationship and thereby compressing the first and second seal rings against one another; and providing between the first and second wafer surfaces a physical barrier, other than the first and second seal rings, against said movement.

2. The method of claim 1, wherein said providing a physical barrier includes creating the physical barrier during said movement.

3. The method of claim 2, wherein said creating includes creating the physical barrier during said compressing.

4. The method of claim 3, including, during said compressing, stopping said movement with said physical barrier and thereby stopping said compressing.

5. The method of claim 2, wherein said creating is effected by said movement.

6. The method of claim 1, including, during said compressing, stopping said movement with said physical barrier and thereby stopping said compressing.

7. The method of claim 1, wherein said providing a physical barrier includes providing said physical barrier as an integral part of at least one of the wafers.

8. A device packaged according to a process that includes the steps of claim 1.

9. A method of preparing a semiconductor wafer for use in packaging a device in a sealed package, comprising:
providing on a surface of said wafer a continuous seal ring having a bonding surface generally parallel to and offset from said wafer surface, said bonding surface adapted to contact a cooperating continuous seal ring on another semiconductor wafer during a seal ring bonding operation; and
providing on said wafer, with said seal ring interposed therebetween, first and second stop surfaces generally parallel to said bonding surface and disposed between said bonding surface and said wafer surface, said first and second stop surfaces respectively adapted to contact cooperating stop surfaces on said another wafer while said bonding surface is contacting said another seal ring during said seal ring bonding operation.

10. The method of claim 9, wherein said providing first and second stop surfaces includes providing on said wafer surface first and second stop structures that respectively define said first and second stop surfaces.

11. The method of claim 9, wherein said providing first and second stop surfaces includes forming in said wafer a trench having a depth that is less than a height of said seal ring and having a bottom that defines said wafer surface.

12. The method of claim 9, wherein said providing a seal ring includes providing the seal ring in surrounding relationship to a portion of said wafer that contains said device.

13. A device packaged according to a process that includes the steps of claim 9.

14. A wafer assembly for use in packaging a device in a sealed package, comprising:
a semiconductor wafer;
a continuous seal ring provided on a surface of said wafer and having a bonding surface generally parallel to and offset from said wafer surface, said bonding surface adapted to contact a cooperating continuous seal ring on another semiconductor wafer during a seal ring bonding operation; and
means defining first and second stop surfaces generally parallel to said bonding surface and disposed between said bonding surface and said wafer surface, said first and second stop surfaces adapted to contact cooperating stop surfaces on said another wafer while said bonding surface is contacting said another seal ring during said seal ring bonding operation, wherein said seal ring is interposed between said first and second stop surfaces.

15. The wafer assembly of claim 14, wherein said means defining first and second stop surfaces includes first and second stop structures provided on said wafer surface and respectively defining said first and second stop surfaces.

16. The wafer assembly of claim 15, wherein said first and second stop structures are configured as continuous rings.

17. The wafer assembly of claim 14, wherein said means defining first and second stop surfaces includes means defining in said wafer a trench having a depth that is less than a height of said seal ring and having a bottom that defines said wafer surface.

18. The wafer assembly of claim 14, wherein said first and second stop surfaces are generally coplanar surfaces.

19. The wafer assembly of claim 14, wherein said first and second stop surfaces have approximately equal surface areas.

20. The wafer assembly of claim 14, wherein said first and second stop surfaces have respectively different surface areas.

21. The wafer assembly of claim 14, wherein said first and second stop surfaces are approximately equidistant from said seal ring.

22. The wafer assembly of claim 14, wherein said first and second stop surfaces are located at respectively different distances from said seal ring.

23. The wafer assembly of claim 14, wherein said seal ring surrounds a portion of said wafer that contains said device.

24. A sealed device package assembly, comprising:
a device provided on a first wafer portion of a first semiconductor wafer and interposed between said first wafer portion and a second wafer portion of a second semiconductor wafer;
a first seal formed between said first and second wafer portions and surrounding a part of said first wafer portion that contains said device; and
a further seal formed between said first and second wafer portions and surrounding said part of said first wafer portion, wherein:
said first seal and said further seal are compressively formed seals and the first seal is a product of more compression than the further seal.

25. The assembly of claim 24, wherein said first and second wafer portions have been singulated from said first and second wafers, respectively.

26. The assembly of claim 24, wherein the first seal is a metal seal and the further seal is of a material other than metal.

* * * * *